United States Patent
Tsutsumi et al.

(10) Patent No.: US 7,926,441 B2
(45) Date of Patent: Apr. 19, 2011

(54) SUBSTRATE TREATMENT METHOD, COATING TREATMENT APPARATUS, AND SUBSTRATE TREATMENT SYSTEM

(75) Inventors: Kenji Tsutsumi, Koshi (JP); Junichi Kitano, Koshi (JP); Osamu Miyahara, Koshi (JP); Hideharu Kyouda, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 546 days.

(21) Appl. No.: 12/016,436

(22) Filed: Jan. 18, 2008

(65) Prior Publication Data
US 2008/0176003 A1 Jul. 24, 2008

(30) Foreign Application Priority Data
Jan. 22, 2007 (JP) .................................. 2007-011243

(51) Int. Cl.
*B05C 15/00* (2006.01)
(52) U.S. Cl. ........ 118/300; 414/936; 414/783; 414/941; 134/6; 134/18
(58) Field of Classification Search .................. 414/936, 414/783, 941; 134/6, 18
See application file for complete search history.

(56) References Cited

U.S. PATENT DOCUMENTS

| 5,964,954 A | * | 10/1999 | Matsukawa et al. | 134/6 |
| 6,752,585 B2 | * | 6/2004 | Reimer et al. | 414/783 |
| 2002/0092472 A1 | * | 7/2002 | Hayashi et al. | 118/715 |
| 2005/0223980 A1 | * | 10/2005 | Awamura et al. | 118/708 |

FOREIGN PATENT DOCUMENTS
JP   3-52226   3/1991
* cited by examiner

*Primary Examiner* — Parviz Hassanzadeh
*Assistant Examiner* — Albert Hilton
(74) *Attorney, Agent, or Firm* — Oblon, Spivak, McClelland, Maier & Neustadt, L.L.P.

(57) ABSTRACT

In the coating treatment apparatus, in a first treatment chamber, the front and rear surfaces of the substrate held by a transfer arm are inverted by a turning mechanism, and a coating solution is applied from a coating nozzle to the rear surface of the substrate. The substrate is transferred into a second treatment chamber, in which the coating solution on the rear surface is heated by a heating unit to cure, thereby forming a coating film on the rear surface of the substrate. The formation of the coating film by the coating treatment apparatus is performed before exposure processing, whereby the rear surface of the substrate can be flat for the exposure processing.

7 Claims, 16 Drawing Sheets

SUBSTRATE TREATMENT METHOD, COATING TREATMENT APPARATUS, AND SUBSTRATE TREATMENT SYSTEM

BACKGROUND OF THE INVENTION

1. Field of the Invention

The present invention relates to a method of treating a substrate, for example, a semiconductor wafer or the like, a coating treatment apparatus, and a substrate treatment system.

2. Description of the Related Art

In photolithography processing in a process of manufacturing a semiconductor device, for example, resist coating treatment of applying a resist solution above a semiconductor wafer (hereinafter, referred to as a "wafer") to form a resist film, exposure processing of exposing the resist film to light under a predetermined pattern, and developing treatment of developing the exposed resist film and so on are performed in sequence, to form a predetermined resist pattern above the wafer. Etching treatment of the wafer is performed using this resist pattern as a mask, and stripping processing of the resist film and cleaning of the wafer are then performed to form a predetermined pattern on the wafer. The process of forming a predetermined pattern in a predetermined layer is generally repeatedly performed 20 to 30 times to manufacture a semiconductor device.

Out of these treatments and processing, the above-described exposure processing is performed, for example, by applying ArF laser, KrF laser, or the like to the resist film on the wafer with the rear surface of the wafer being suction-held by a chuck in the apparatus for performing the exposure processing. If, for example, contaminants adhere to the rear surface of the wafer when the exposure processing is performed, the wafer is not horizontally held by the chuck, thus causing defocus during the exposure processing. Accordingly, it is necessary that the wafer is horizontally held by the chuck, that is, the rear surface of the wafer sucked by the chuck is flat, in order to appropriately perform the exposure processing.

Hence, a scribing apparatus including a transfer arm for inverting the front and rear surfaces of the wafer, a freely rotatable spin chuck for holding the wafer, and a scribing brush for cleaning the front and rear surfaces of the wafer held by the spin chuck has been conventionally proposed as an apparatus for removing the contaminants on the rear surface of the wafer. Conventionally, before performance of the exposure processing for the wafer, the scribing apparatus is used to first direct the rear surface of the wafer upward by means of the transfer arm and hold the wafer in this state by means of the spin chuck. The scribing brush is brought into contact with the rear surface of the wafer while rotating the spin chuck is rotating, thereby removing the contaminants adhering to the rear surface of the wafer (Japanese Patent Publication Laid-open No. Hei 3-52226).

However, even if the contaminants on the rear surface of the wafer are removed, minute scratches may be generated on the rear surface of the wafer during various kinds of treatments and processing in the process of manufacturing the wafer to cause projections and depressions on the rear surface of the wafer. Especially when the etching treatment is performed, the rear surface of the wafer is likely to get minute scratches if the surface temperatures of the wafer and the electrostatic chuck are increased during the etching treatment due to the difference in coefficient of thermal expansion between the wafer and the electrostatic chuck holding the wafer. Due to such minute scratches on the rear surface of the wafer, the wafer is not horizontally held during the exposure processing, thus causing defocus.

SUMMARY OF THE INVENTION

The present invention has been developed in consideration of the above points, and its object is to planarize the rear surface of a substrate before exposure processing in order to appropriately perform the exposure processing with the substrate being horizontally held.

To attain the above object, in the present invention, a substrate treatment method of performing at least photolithography processing and etching treatment for a substrate in this order a plurality of times, includes the step of forming a coating film on a rear surface of the substrate before exposure processing in the photolithography processing is performed.

According to the substrate treatment method of the present invention, the coating film is formed on the rear surface of the substrate before performance of exposure processing, for example, immediately before exposure processing, so that even if the rear surface of the substrate has got minute scratches, for example, during the transfer of the substrate performed before the exposure processing in the photolithography processing and during the etching treatment performed before the photolithography processing, the coating film is formed to cover the scratches. As a result, the rear surface of the substrate can be flat without projections and depressions in the exposure processing to be performed after the formation of the coating film. Accordingly, the substrate can be horizontally held during the exposure processing, so that the exposure processing can be appropriately performed. In this case, as a matter of course, the step of forming the coating film on the rear surface of the substrate may be performed before the exposure processing in the photolithography processing for the first time is performed. Thereby, even if the rear surface of the substrate has got minute scratches during performance of treatment steps prior to the exposure processing performed in the photolithography processing for the first time, for example, the step of forming a resist film, and during the transfer of the substrate, the coating film is formed before the exposure processing, the rear surface of the substrate can be flat for the exposure processing.

When forming a coating film on the rear surface of the substrate, for example, with the rear surface of the substrate directed upward, a coating solution may be applied to the rear surface of the substrate, and the coating solution applied on the rear surface of the substrate may be cured. Thereby, the coating film can be formed on the rear surface of the substrate.

The method may include the step of, immediately before the step of forming a coating film, cleaning the rear surface of the substrate. This removes the contaminants on the rear surface of the substrate immediately before the coating film is formed on the rear surface of the substrate, thereby ensuring that the coating film can be planarized more reliably.

According to another aspect, the present invention is a coating treatment apparatus for forming a coating film on a rear surface of a substrate, including: a treatment container housing the substrate; a partition member partitioning the treatment container into a first treatment chamber and a second treatment chamber; a transfer arm transferring the substrate transferred into the treatment container; a turning mechanism supporting the transfer arm and turning the transfer arm around a horizontal axis; a raising and lowering mechanism supporting the turning mechanism and raising and lowering the turning mechanism; a transfer mechanism supporting the raising and lowering mechanism and transferring the raising and lowering mechanism in the horizontal direction between the first treatment chamber and the second treatment chamber; a substrate holding unit located in the first treatment chamber for horizontally holding the substrate with the rear surface of the substrate directed upward; a coating nozzle located in the first treatment chamber for applying a coating solution to the rear surface of the substrate held by the substrate holding unit; and a curing processing unit located in the second treatment chamber for curing the coating solution applied from the coating nozzle to the rear surface of the substrate.

According to the coating treatment apparatus of the present invention, the rear surface of the substrate is directed upward by the transfer arm and the turning mechanism, the coating solution is applied from the coating nozzle to the rear surface, and the coating solution applied on the rear surface of the substrate is cured by the curing processing unit, whereby the coating film can be formed on the rear surface of the substrate. Accordingly, the rear surface of the substrate can be planarized.

Since the partition member for partitioning the treatment container housing the substrate into the first treatment chamber and the second treatment chamber is provided, atmospheres in the first treatment chamber in which the coating solution is applied and the second treatment chamber in which the coating solution is cured can be independently controlled. In addition, the coating film can be formed on the rear surface of the substrate in one coating treatment apparatus, whereby the coating film can be smoothly formed to improve the throughput of the substrate treatment.

A rotating mechanism rotating the substrate holding unit around a vertical axis may be provided below the substrate holding unit. The rotating mechanism rotates the substrate held by the substrate holding unit, thus allowing the coating solution applied on the rear surface of the substrate to uniformly spread.

The curing processing unit may include a heating unit heating the coating solution applied from the coating nozzle to the rear surface of the substrate, or may include any of an ultraviolet irradiation unit applying ultraviolet rays and an electron beam irradiation unit applying electron beams, to the coating solution applied from the coating nozzle to the rear surface of the substrate.

The coating treatment apparatus may be located in the same substrate treatment system with the exposure processing apparatus for performing exposure processing on the substrate. This ensures that the coating film can be formed on the rear surface of the substrate in line, thus smoothly performing a series of treatment and processing of the substrate.

According to the present invention, the rear surface of the substrate can be planarized before exposure processing, thus ensuring that preferable exposure processing can be performed.

DETAILED DESCRIPTION OF THE INVENTION

Figure 1:
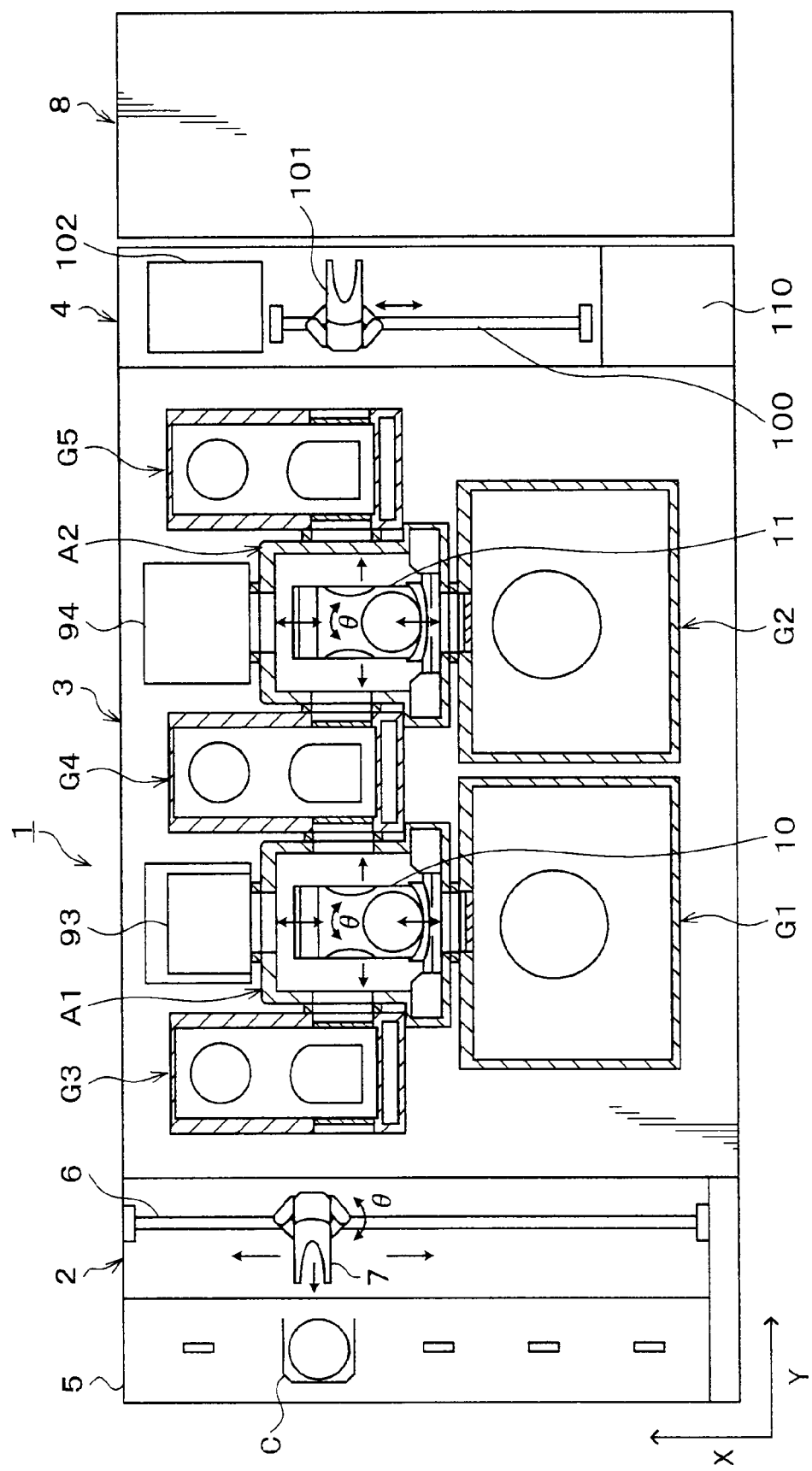
FIG. 1 is a plan view schematically showing the outline of a configuration of a coating and developing treatment system incorporating a coating treatment apparatus according to an embodiment.
Figure 2:
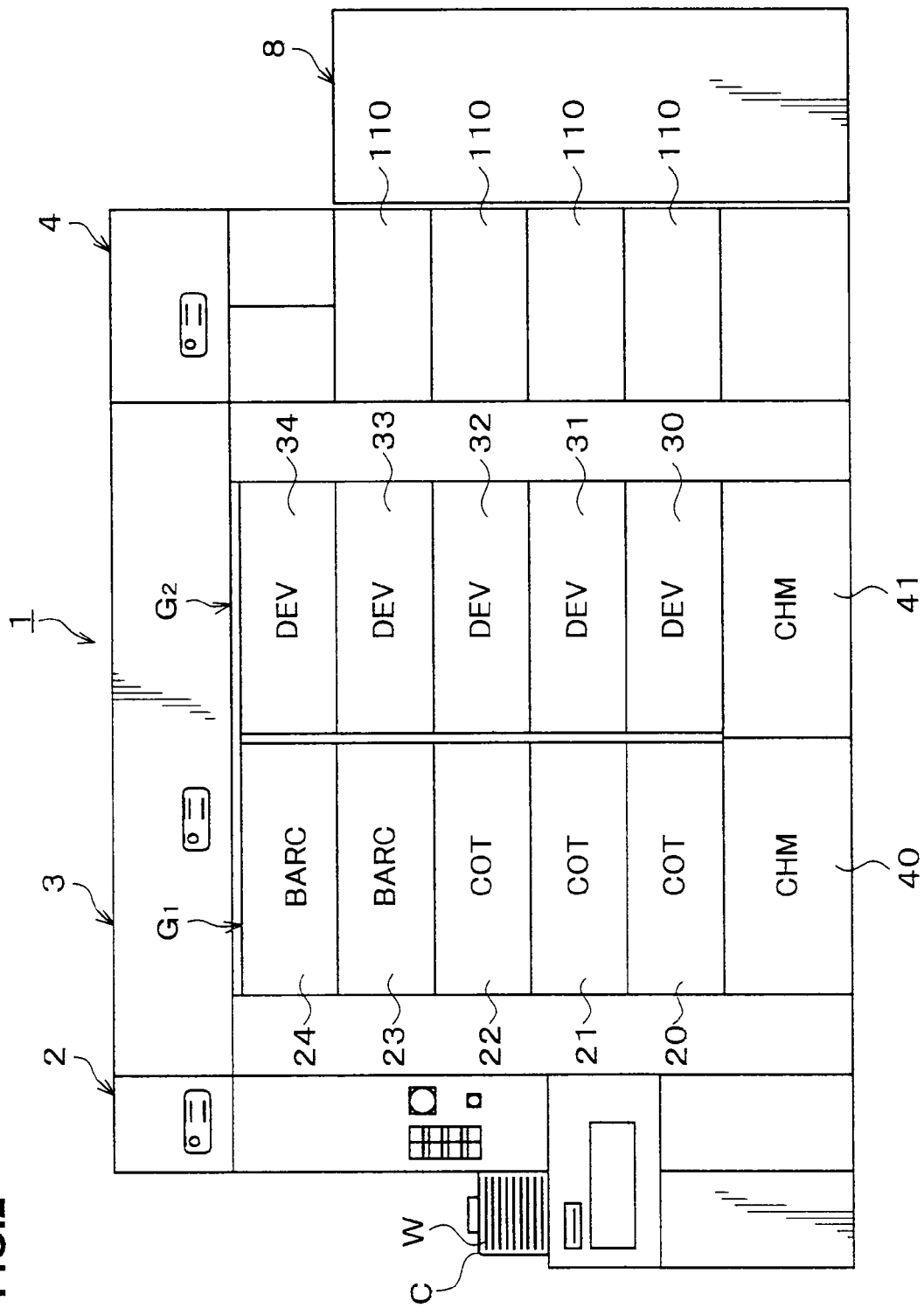
FIG. 2 is a front view of the coating and developing treatment system according to the embodiment.
Figure 3:
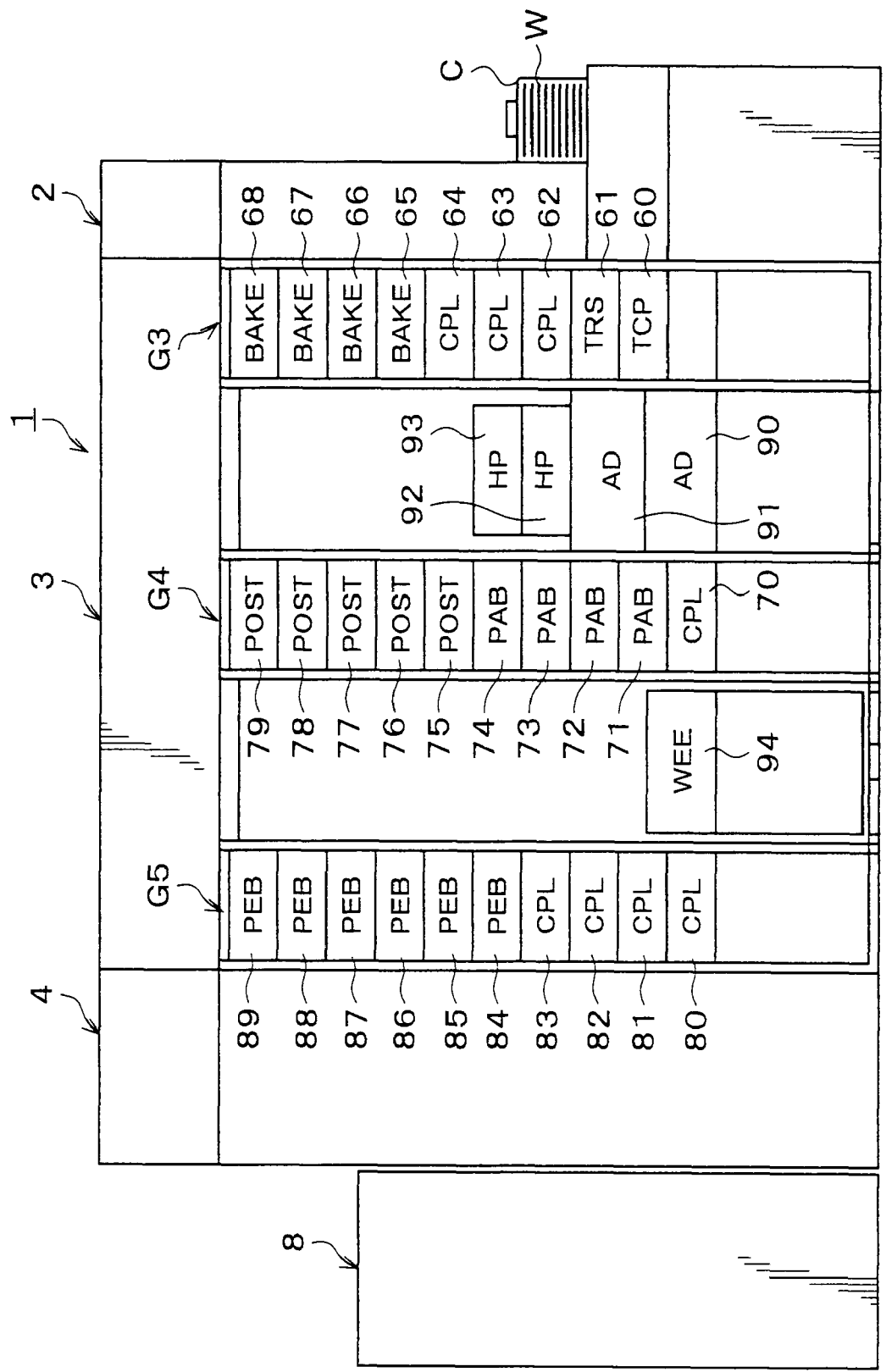
FIG. 3 is a rear view of the coating and developing treatment system according to the embodiment.

Hereinafter, a preferred embodiment of the present invention will be described. FIG. 1 is a plan view showing the outline of a configuration of a coating and developing treatment system 1 as a substrate treatment system incorporating a coating treatment apparatus according to the embodiment, FIG. 2 is a front view of the coating and developing treatment system 1, and FIG. 3 is a rear view of the coating and developing treatment system 1.

The coating and developing treatment system 1 has, as shown in FIG. 1, a configuration in which, for example, a cassette station 2 for transferring 25 wafers W per cassette as a unit from/to the outside into/from the coating and developing treatment system 1 and transferring the wafers W into/out of a cassette C; a processing station 3 including a plurality of various kinds of processing and treatment units, which are multi-tiered, for performing predetermined processing or treatment in a manner of single wafer processing in the photolithography process; and an interface section 4 for delivering the wafers W to/from an exposure processing apparatus 8 provided adjacent to the processing station 3, are integrally connected.

In the cassette station 2, a cassette mounting table 5 is provided and configured such that a plurality of cassettes C can be mounted thereon in a line in an X-direction (a top-to-bottom direction in FIG. 1). In the cassette station 2, a wafer transfer body 7 is provided which is movable in the X-direction on a transfer path 6. The wafer transfer body 7 is also movable in a wafer-arrangement direction of the wafers W housed in the cassette C (a Z-direction; the vertical direction), and thus can selectively access the wafer W in each of the cassettes C arranged in the X-direction.

The wafer transfer body 7 is rotatable in a θ-direction around a Z-axis, and can access a temperature regulating unit 60 for regulating the temperature of the wafer W and a transition unit 61 for passing the wafer W included in a later-described third processing unit group G3 on the processing station 3 side.

The processing station 3 adjacent to the cassette station 2 includes, for example, five processing unit groups G1 to G5 in each of which a plurality of processing and treatment units are multi-tiered. On the side of the negative direction in the X-direction (the downward direction in FIG. 1) in the processing station 3, the first processing unit group G1 and the second processing unit group G2 are placed in order from the cassette station 2 side. On the side of the positive direction in the X-direction (the upward direction in FIG. 1) in the processing station 3, the third processing unit group G3, the fourth processing unit group G4, and the fifth processing unit group G5 are placed in order from the cassette station 2 side. Between the third processing unit group G3 and the fourth processing unit group G4, a first transfer unit A1 is provided, and a first transfer arm 10 that supports and transfers the wafer W is provided inside the first transfer unit A1. The first transfer arm 10 can selectively access the processing and treatment units in the first processing unit group G1, the third processing unit group G3, and the fourth processing unit group G4 and transfer the wafer W to them. Between the fourth processing unit group G4 and the fifth processing unit group G5, a second transfer unit A2 is provided, and a second transfer arm 11 that supports and transfers the wafer W is provided inside the second transfer unit A2. The second transfer arm 11 can selectively access the processing and treatment units in the second processing unit group G2, the fourth processing unit group G4, and the fifth processing unit group G5 and transfer the wafer W to them.

In the first processing unit group G1, as shown in FIG. 2, solution treatment units each for supplying a predetermined liquid to the wafer W to perform treatment, for example, resist coating units 20, 21, and 22 each for applying a resist solution to the wafer W, and bottom coating unit 23 and 24 each for forming an anti-reflection film that prevents reflection of light at the time of exposure processing, are five-tiered in order from the bottom. In the second processing unit group G2, solution treatment units, for example, developing treatment units 30 to 34 each for supplying a developing solution to the wafer W to develop it are five-tiered in order from the bottom. Further, chemical chambers 40 and 41 for supplying various kinds of treatment solutions to the solution treatment units in the processing unit groups G1 and G2 are provided at the lowermost tiers of the first processing unit group G1 and the second processing unit group G2, respectively.

As shown in FIG. 3, in the third processing unit group G3, for example, the temperature regulating unit 60, the transition unit 61, high-precision temperature regulating units 62 to 64 each for regulating the temperature of the wafer W under a high precision temperature control, and high-temperature thermal processing units 65 to 68 each for heat-processing the wafer W at a high temperature, are nine-tiered in order from the bottom.

In the fourth processing unit group G4, for example, a high-precision temperature regulating unit 70, pre-baking units 71 to 74 each for heat-processing the wafer W after resist coating treatment, and post-baking units 75 to 79 each for heat-processing the wafer W after developing treatment, are ten-tiered in order from the bottom.

In the fifth processing unit group G5, a plurality of thermal processing units each for thermally processing the wafer W, for example, high-precision temperature regulating units 80 to 83, and post-exposure baking units 84 to 89, are ten-tiered in order from the bottom.

As shown in FIG. 1, on the positive direction side in the X-direction to the first transfer unit A1, a plurality of processing and treatment units are arranged, for example, adhesion units 90 and 91 each for performing hydrophobic treatment on the wafer W and heating units 92 and 93 each for heating the wafer W being four-tiered in order from the bottom as shown in FIG. 3. As shown in FIG. 1, on the positive direction side in the X-direction to the second transfer unit A2, for example, an edge exposure unit 94 is disposed which selectively exposes only the edge portion of the wafer W to light.

In the interface section 4, for example, a wafer transfer body 101 moving on a transfer path 100 extending in the X-direction, a buffer cassette 102, and coating treatment apparatuses 110 each for forming a coating film on the rear surface of the wafer W according to the present invention are provided as shown in FIG. 1. The wafer transfer body 101 is movable in the Z-direction and also rotatable in the θ-direction, and thus can access the exposure processing apparatus 8 adjacent to the interface section 4, the buffer cassette 102, the coating treatment apparatuses 110, and the fifth processing unit group G5 and transfer the wafer W to them. The coating treatment apparatuses 110 are provided on the side of the negative direction in the X-direction (the downward direction in FIG. 1) in the interface section 4 and four-tiered, for example, as shown in FIG. 2.

Next, the configuration of the above-described coating treatment apparatus 110 will be described based on FIG. 4. The coating treatment apparatus 110 has a treatment container 150 whose inside can be closed. On one side surface of the treatment container 150, a transfer-in/out port 151 for the wafer W is provided in a surface facing a transfer-in region for the wafer transfer body 101 being a transfer means for the wafer W, and an opening/closing shutter 152 is provided at the transfer-in/out port 151. Inside the treatment container 150, a partition member 153 is provided that partitions the inside of the treatment container 150 into a first treatment chamber 111 and a second treatment chamber 112, and the insides of the first treatment chamber 111 and the second treatment chamber 112 are closable, respectively. The partition member 153 is formed with a passing port 154 through which a later-described transfer arm 160, turning mechanism 163, and transfer mechanism 166 can pass, and an opening and closing shutter 155 is provided at the passing port 154.

Figure 5:
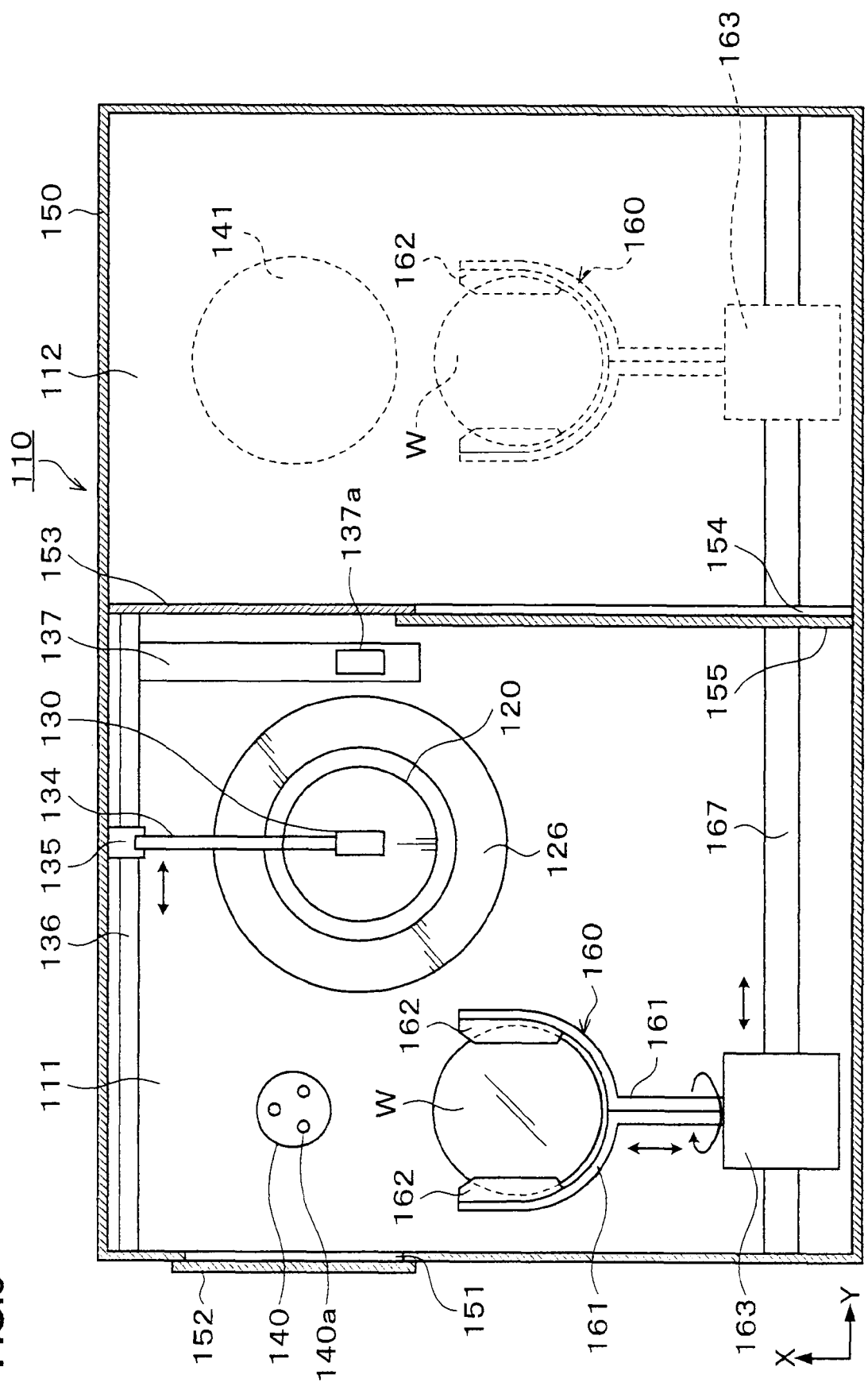
FIG. 5 is a plan view schematically showing the outline of a configuration of the coating treatment apparatus according to the embodiment.

Inside the first treatment chamber 111, a wafer delivery table 140 is provided for mounting the wafer W transferred thereinto through a transfer-in/out port 151 as shown in FIG. 5. On the wafer delivery table 140, for example, three support pints 140a for supporting the wafer W are provided.

Figure 6:
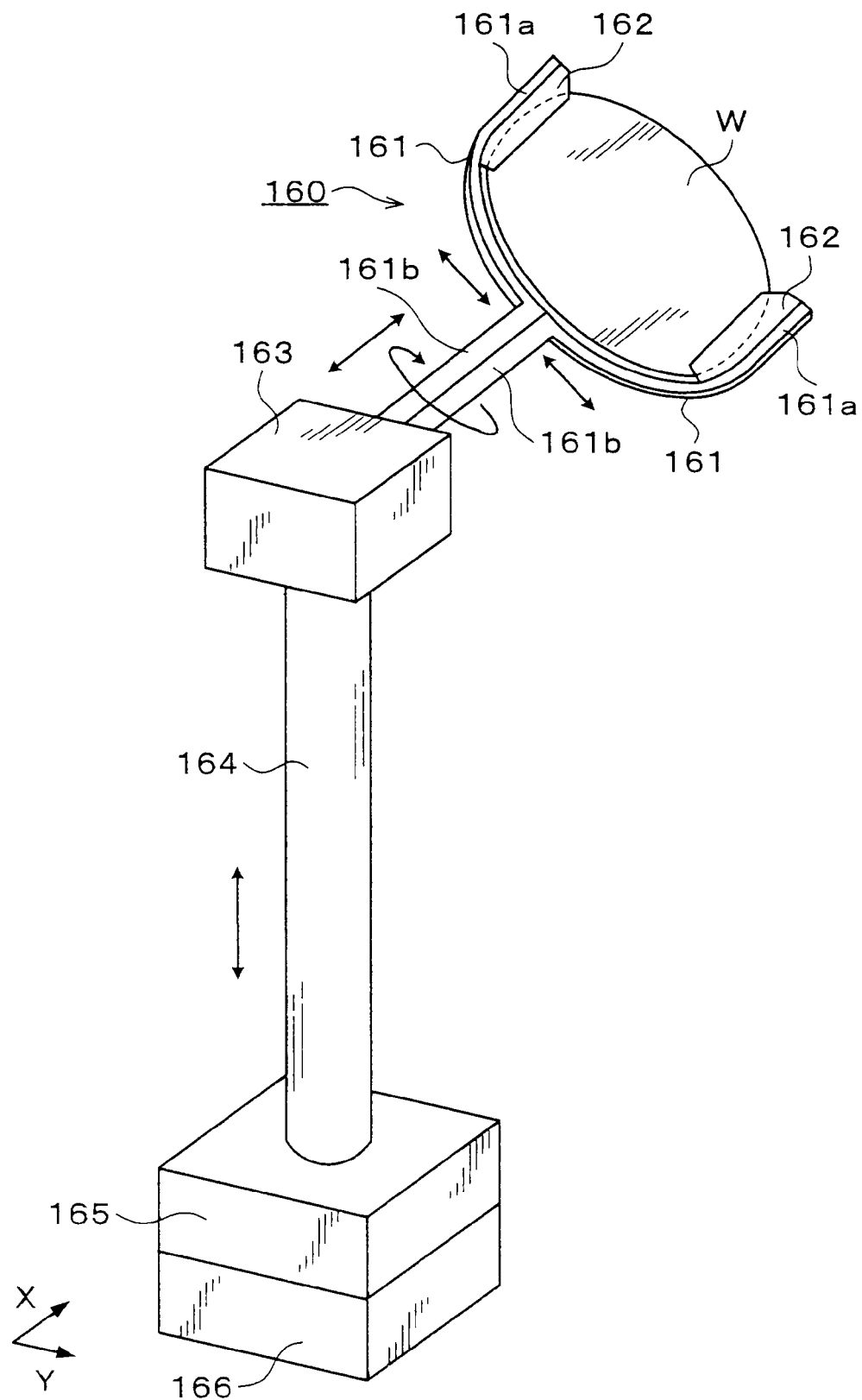
FIG. 6 is a perspective view of a transfer arm, a turning mechanism and a transfer mechanism.
Figure 7:
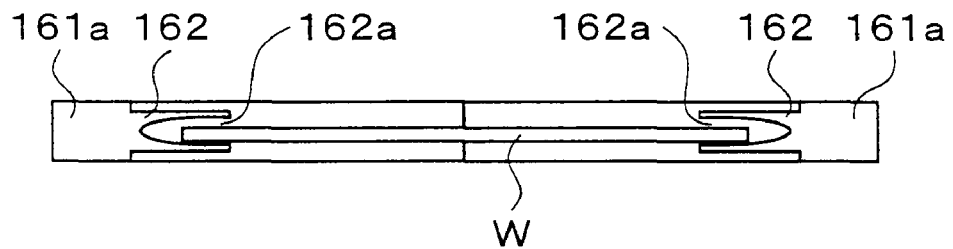
FIG. 7 is a side view of the transfer arm holding a wafer.

Inside the coating treatment apparatus 110, a transfer arm 160 is provided which receives the wafer W from the wafer delivery table 140 and transfers the wafer W between the first treatment chamber 111 and the second treatment chamber 112. The transfer arm 160 has a pair of chuck portions 161 capable of approaching to and separating from each other as shown in FIG. 6. The chuck portion 161 has a flame portion 161a formed in a quarter ring, and an arm portion 161b integrally formed with the flame portion 161a for supporting the flame portion 161a. The flame portions 161a are provided with respective wafer clamp portions 162, and tapered grooves 162a are formed in the side surfaces of the wafer clamp portions 162 as shown in FIG. 7. The pair of separated chuck portions 161 approach to each other, whereby peripheral portions of the wafer W are inserted into the tapered grooves 162a so that the wafer W is supported.

The transfer arm 160 is supported by a turning mechanism 163 as shown in FIG. 6. The turning mechanism 163 has a drive unit (not shown) such as a motor or the like therein, and allows the transfer arm 160 to turn around the horizontal axis (around the X-axis) and expand and contract in the horizontal direction (the X-direction). In other words, the front and rear surfaces of the wafer W held by the transfer arm 160 can be inverted, and the wafer W can be moved in the horizontal direction (the X-direction).

A shaft 164 is provided on the lower surface of the turning mechanism 163, and the lower end of the shaft 164 is connected to a raising and lowering mechanism 165. The raising and lowering mechanism 165 has a drive unit (not shown) such as a motor or the like therein, and can raise and lower the turning mechanism 163 and the transfer arm 160. The raising and lowering mechanism 165 is supported by a transfer mechanism 166, and the transfer mechanism 166 allows the turning mechanism 163 and the transfer arm 160 to move between the first treatment chamber 111 and the second treatment chamber 112 along a guide rail 167 provided along the longitudinal direction (the Y-direction) of the treatment container 150 as shown in FIG. 5. In other words, the wafer W supported by the transfer arm 160 can be transferred between the first treatment chamber 111 and the second treatment chamber 112.

Figure 4:
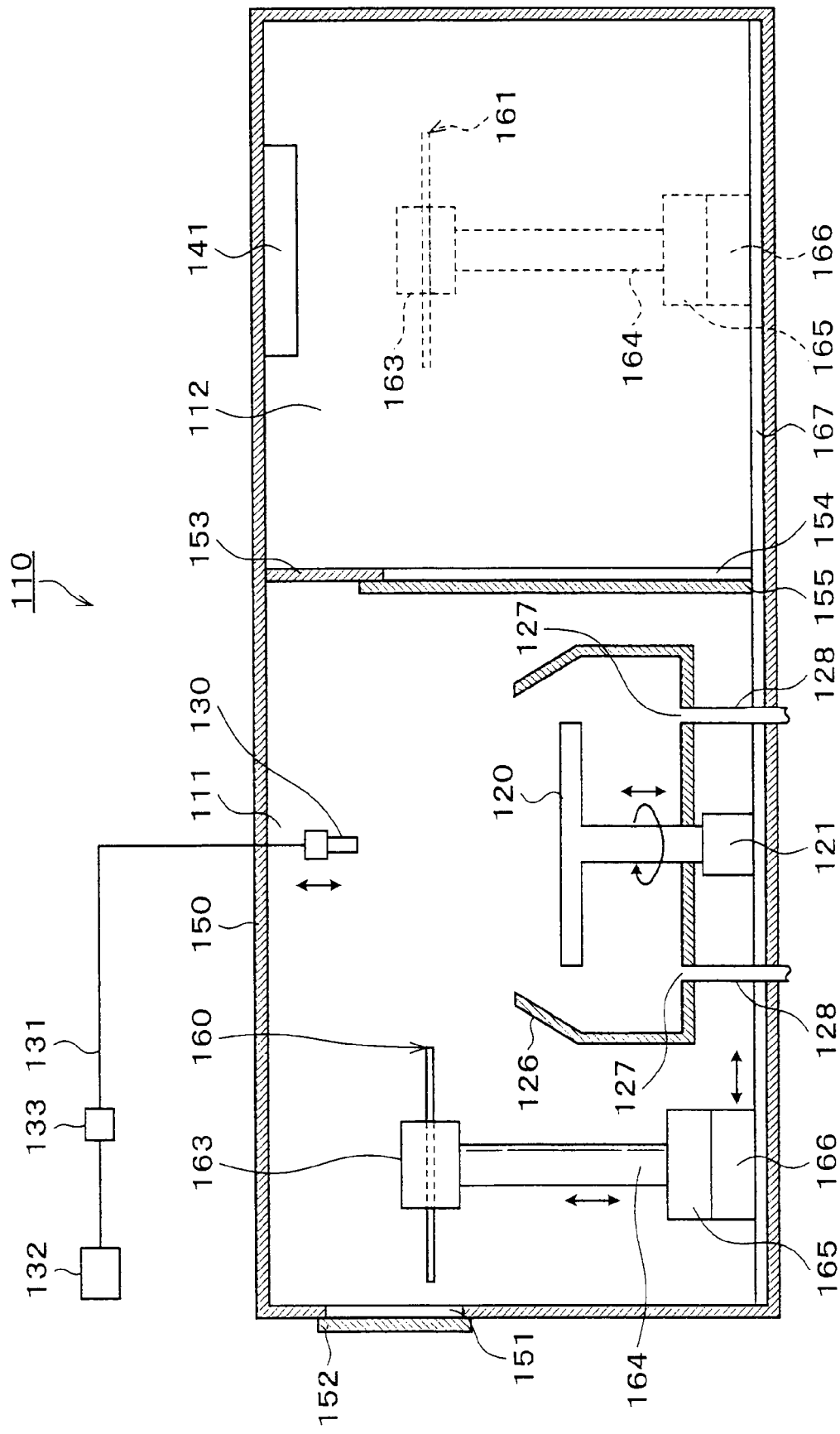
FIG. 4 is a longitudinal sectional view schematically showing the outline of a configuration of the coating treatment apparatus according to the embodiment.
Figure 8:
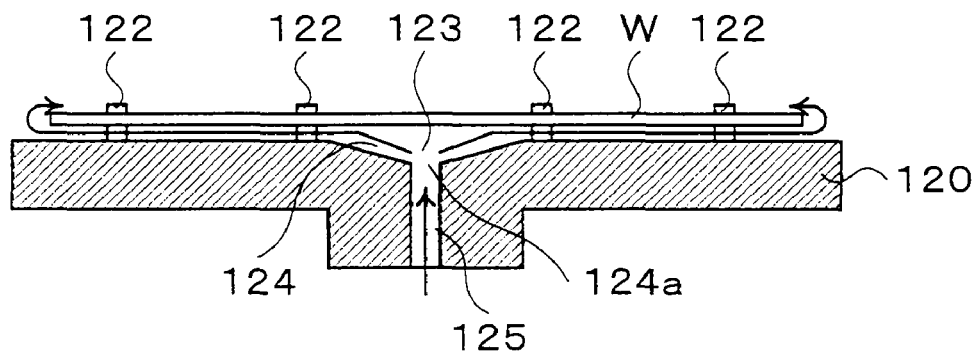
FIG. 8 is a longitudinal sectional view of a spin chuck.

Inside the first treatment chamber 111, a spin chuck 120 as a substrate holding unit is provided which horizontally holds the wafer W with the rear surface of the wafer W directed upward as shown in FIG. 4. The spin chuck 120 can rotate around the vertical axis and raise and lower by means of a rotating mechanism 121 including a motor and the like. On the upper surface of the spin chuck 120, for example, eight holding pins 122 for holding the peripheral portion of the wafer W are provided along the peripheral portion of the wafer W as shown in FIG. 8.

Figure 9:
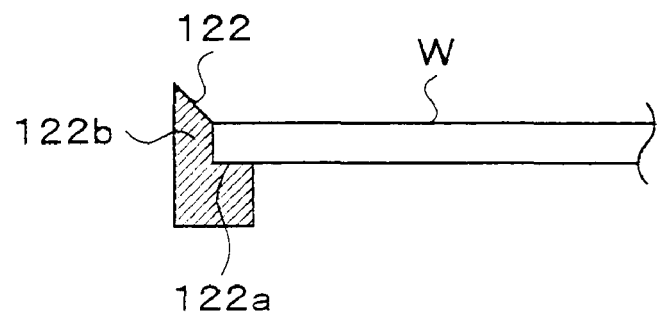
FIG. 9 is a longitudinal sectional view showing a structure of a support pin of the spin chuck.

The holding pin 122 has a horizontal holding surface 122a for directly holding the wafer W and a vertical wall 122b parallel to the peripheral side edge of the wafer W as shown in FIG. 9, and the top portion of the vertical wall 122b has a height to protrude from the upper surface of the wafer W when the wafer W is held on the holding surface 122a. At the central portion of the upper surface of the spin chuck 120, a recessed portion 124 is formed downward as shown in FIG. 8, so that a space 123 is formed between the recessed portion 124 and the wafer W. At the central portion of the upper surface of the spin chuck 120, a gas supply port 124a is formed which jets an inert gas, for example, nitrogen gas toward the space 123, and a gas supply pipe 125 penetrating through the spin chuck 120 is connected to the gas supply port 124a. The inert gas jetted from the gas supply port 124a toward the space 123 flows from the side of the lower surface of the wafer W, then around the peripheral side edge, to the upper surface. Then, the pressure of the inert gas flowing around to the side of the upper surface of the wafer W presses and fixes the wafer W onto the holding pins 122. For this technique, the publicly known technique described in JP H3-52226 can be employed.

Around the spin chuck 120, a cup body 126 is provided as shown in FIG. 4. The cup body 126 has an opening portion formed in its upper face which is larger than the wafer W and the spin chuck 120 to allow the spin chuck 120 holding the wafer W thereon to rise and lower therethrough. The bottom portion of the cup body 126 is formed with drain ports 127 for draining a coating solution dropping out of the top of the wafer W, and drain pipes 128 are connected to the drain ports 127.

Above the spin chuck 120, a coating nozzle 130 is located for supplying a coating solution onto the central portion of the rear surface of the wafer W as shown in FIG. 4. The coating nozzle 130 is connected to a coating solution supply source 132 via a coating solution supply pipe 131. The coating solution supply pipe 131 is provided with a supply controller 133 including a valve, a flow control unit, and so on. As the coating solution supplied from the coating solution supply source 132, for example, SOG (Spin On Glass) material, or a resist of an organic material or the like is used.

The coating nozzle 130 is connected to a moving mechanism 135 via an arm 134 as shown in FIG. 5. The arm 134 is configured such that it can be moved by the moving mechanism 135 along a guide rail 136 provided along the Y-direction of the first treatment chamber 111, from a waiting region 137 provided outside on the side of one end of the cup body 126 (the right side in FIG. 5) toward the other end side and vertically moved. The waiting region 137 is configured to be able to accommodate the coating nozzle 130 and includes a cleaning portion 137a which can clean the tip end portion of the coating nozzle 130.

In an upper portion of the second treatment chamber 112, a lamp heating unit 141 is provided which cures the coating solution applied on the wafer W as shown in FIG. 4. The lamp heating unit 141 can cure the coating solution on the wafer W by heating the wafer W.

The coating and developing treatment system 1 incorporating the coating treatment apparatus 110 according to this embodiment is configured as described above, and the photolithography processing and various kinds of treatments performed on the wafer W after completion of the photolithography processing which are performed in this coating and developing treatment system 1 will be described next.

First of all, one wafer W is taken out of the cassette C on the cassette mounting table 5 by the wafer transfer body 7 and transferred to the temperature regulating unit 60 in the third processing unit group G3. The wafer W transferred to the temperature regulating unit 60 is temperature-regulated to a predetermined temperature and is then transferred by the first transfer arm 10 into bottom coating unit 23, where an anti-reflection film is formed. The wafer W above which the anti-reflection film has been formed is transferred by the first transfer arm 10 to the heating unit 92, the high-temperature thermal processing unit 65, and the high-precision temperature regulating unit 70 in sequence so that predetermined processing is performed in each of the units. Thereafter, the wafer W is transferred to the resist coating unit 20.

After a resist film has been formed over the front surface of the wafer W in the resist coating unit 20, the wafer W is transferred by the first transfer arm 10 to the pre-baking unit 71 and subjected to heating processing and subsequently transferred by the second transfer arm 11 to the edge exposure unit 94 and the high-precision temperature regulating unit 83 in sequence so that the wafer W is subjected to predetermined processing in each of the units. Thereafter, the wafer W is transferred by the wafer transfer body 101 in the interface section 4 to the coating treatment apparatus 110 of this embodiment.

The wafer W transferred into the treatment container 150 through its transfer-in/out port 151 is mounted on the wafer delivery table 140 by the wafer transfer body 101. Then, the turning mechanism 163 extends the transfer arm 160 to a position of the wafer delivery table 140. Thereafter, the pair of separated chuck portions 161 of the transfer arm 160 then approach to each other, whereby the wafer W is held in the tapered grooves 162a.

The turning mechanism 163 then turns and inverts the wafer W held by the transfer arm 160 to direct the rear surface of the wafer W upward. In this state, the transfer mechanism 166 moves the wafer W to above the spin chuck 120. The spin chuck 120 is then raised and the pair of chuck portions 161 of the transfer arm 160 are separated from each other to pass the wafer W from the transfer arm 160 to the spin chuck 120. The transfer arm 160 is retracted from above the spin chuck 120 and the inert gas is jetted from the gas supply port 124a of the spin chuck 120, whereby the wafer W is horizontally held on the spin chuck 120. The spin chuck 120 is then lowered to lower the wafer W to a predetermined position.

Subsequently, the rotating mechanism 121 rotates the wafer W, and the coating nozzle 130 is moved to above the central portion of the wafer W. The coating solution is discharged from the coating nozzle 130 to the central portion of the rear surface of the wafer W. The discharged coating solution spreads over the rear surface of the wafer W by the centrifugal force generated by rotation of the wafer W. Thereafter, the coating nozzle 130 is moved from above the central portion of the wafer W to the waiting region 137. Note that the coating solution may be applied within a range where the rear surface of the wafer W is sucked in the exposure processing apparatus 8, and the coating solution may not be applied at the peripheral portion of the rear surface of the wafer W.

After spread of the coating solution on the rear surface of the wafer W, the wafer W on the spin chuck 120 is raised to a predetermined position, and the transfer arm 160 is extended to move to above the spin chuck 120. The wafer W is passed from the spin chuck 120 to the transfer arm 160.

Next, the transfer mechanism 166 moves the wafer W into the second treatment chamber 112. The turning mechanism 163, the raising and lowering mechanism 165, and the transfer mechanism 166 adjust the position of the wafer W so that the wafer W is located directly below the lamp heating unit 141 as shown by broken line portions in FIG. 4 and FIG. 5. Then, with the wafer W being held by the transfer arm 160, the lamp heating unit 141 heats the wafer W to cure the coating solution on the rear surface of the wafer W.

After formation of the coating film by curing the coating solution on the rear surface of the wafer W, the transfer mechanism 166 moves again the wafer W into the first treatment chamber 111. The turning mechanism 163 then turns and inverts the wafer W to direct the front surface of the wafer W upward, and the wafer W is passed from the transfer arm 160 to the wafer delivery table 140. The wafer W is then transferred by the wafer transfer body 101 to the outside of the coating treatment apparatus 110.

The wafer W transferred to the outside of the coating treatment apparatus 110 by the wafer transfer body 101 is transferred to the exposure processing apparatus 8. In the exposure processing apparatus 8, the coating film on the rear surface of the wafer W is suction-held and the resist film above the wafer W is exposed to light under a predetermined pattern. The wafer W for which the exposure processing has been finished is transferred by the wafer transfer body 101 to the post-exposure baking unit 84, where the wafer W is subjected to predetermined processing.

After completion of the thermal processing in the post-exposure baking unit 84, the wafer W is transferred by the second transfer arm 11 to the high-precision temperature regulating unit 81, where the wafer W is temperature-regulated, and then transferred to the developing treatment unit 30, where developing treatment is performed on the wafer W so that a pattern is formed in the resist film. The wafer W is then transferred by the second transfer arm 11 to the post-baking unit 75, where the wafer W is subjected to heating processing, and subsequently transferred to the high-precision temperature regulating unit 63, where the wafer W is temperature-regulated. The wafer W is then transferred by the first transfer arm 10 to the transition unit 61, and returned by the wafer transfer body 7 to the cassette C, with which a series of photolithography process ends.

Figure 10:
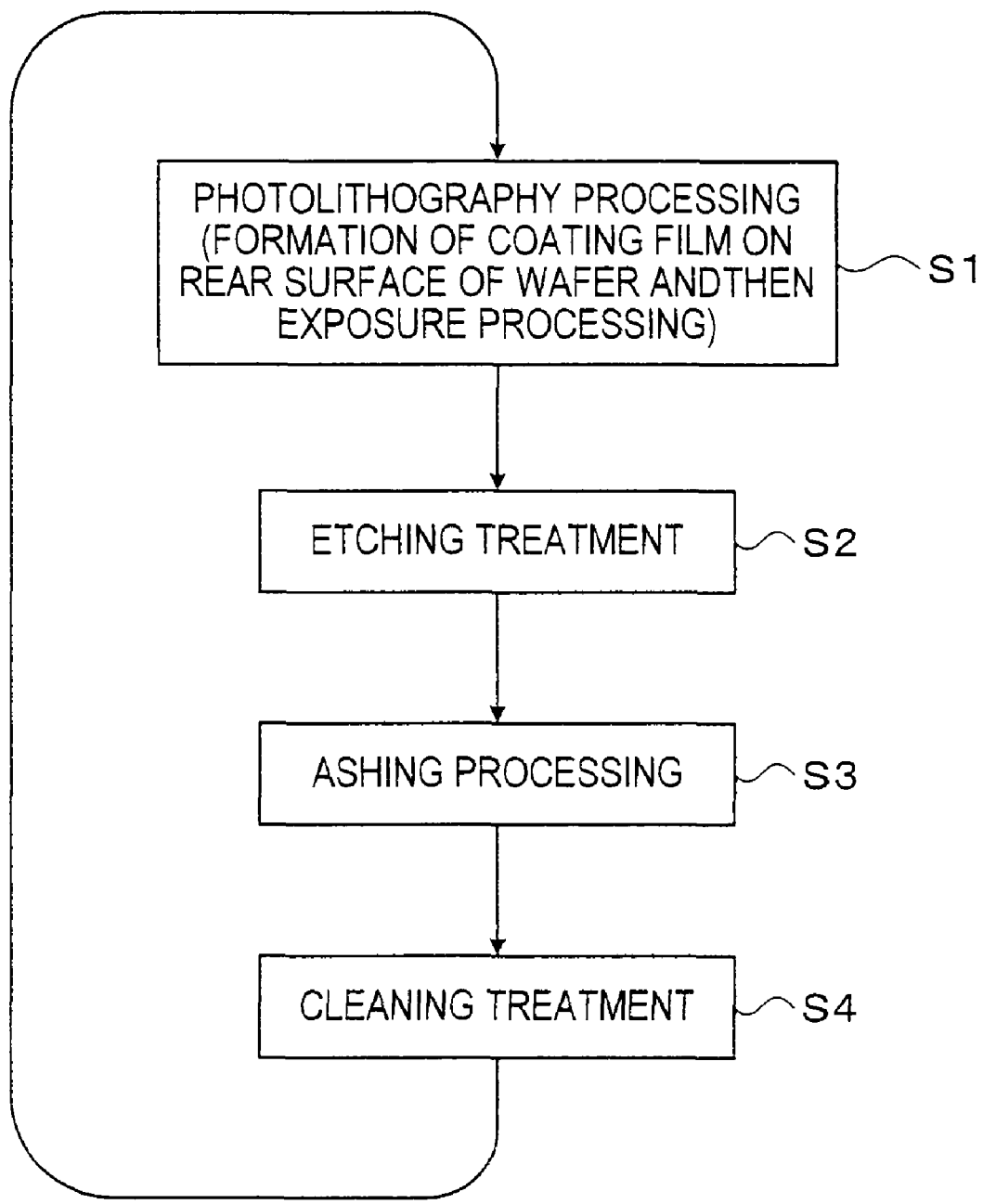
FIG. 10 is a flowchart showing a procedure of wafer treatment.

Showing a flow of various kinds of treatments and processing performed on the wafer W in FIG. 10, after photolithography processing is performed as described above (Step S1), etching treatment of selectively etching the thin film above the wafer W is performed using the pattern formed in the resist film above the wafer W as a mask (Step S2). Then, ashing processing of removing the resist film remaining above the wafer W, for example, by generating plasma is performed (Step S3), and cleaning treatment of removing contaminants such as metal and organic substance adhering onto the wafer W is then performed (Step S4). Through such various kinds of treatment and processing processes, a predetermined pattern is formed in one layer above the wafer W. The above photolithography processing, etching treatment, ashing processing, and cleaning treatment are repeated in this order a predetermined number of times, whereby multilayer patterns are formed above the wafer W, with which a series of treatment and processing of wafer W ends.

According to the above embodiment, the coating film is formed on the rear surface of the wafer W in the coating treatment apparatus 110 immediately before the exposure processing for the wafer W is performed in the exposure processing apparatus 8, so that even if the rear surface of the wafer W has got minute scratches during the time when other treatment and processing such as the etching treatment and so on before reaching the exposure processing apparatus 8, the coating film is formed to cover the scratches to planarize the rear surface of the wafer W. Therefore, the rear surface which has been planarized with the coating film can be supported in the exposure processing, thereby ensuring that the wafer W can be properly horizontally held to allow the exposure processing to be appropriately performed.

Planarizing the rear surface of the wafer W before the exposure of the pattern is particularly effective in the case of performing double patterning processing that is used for forming a fine pattern on the wafer W. In the double patterning processing, the pattern to be formed in a fine layer on the wafer W is subjected to exposure processing in twice in which the etching treatment is performed after the exposure processing for the first time and the exposure processing for the second time is performed on the same layer. When the coating and developing treatment system 1 according to this embodiment is used for the double patterning processing, the coating film can be formed on the rear surface of the wafer W before the exposure processing for the second time after the etching treatment to planarize the rear surface, so that the exposure processing can be appropriately performed.

Since the coating nozzle 130 and the lamp heating unit 141 are provided in the coating treatment apparatus 110 in this embodiment, the processing from the application of the coating solution to the rear surface of the wafer W to the curing of the coating solution by heating can be performed in one apparatus. Therefore, the formation of the coating film can be smoothly performed.

Since the partition member 153 for partitioning the treatment container 150 housing the wafer W into the first treatment chamber 111 and the second treatment chamber 112 is provided in this embodiment, atmospheres in the first treatment chamber 111 in which the coating solution is applied to the rear surface of the wafer W and the second treatment chamber 112 in which the coating solution is cured by heating can be independently controlled.

The coating treatment apparatus 110 is provided in the coating and developing treatment system 1 in this embodiment, whereby the coating film can be formed on the rear surface of the wafer W in line to improve the throughput of wafer treatment.

Figure 11:
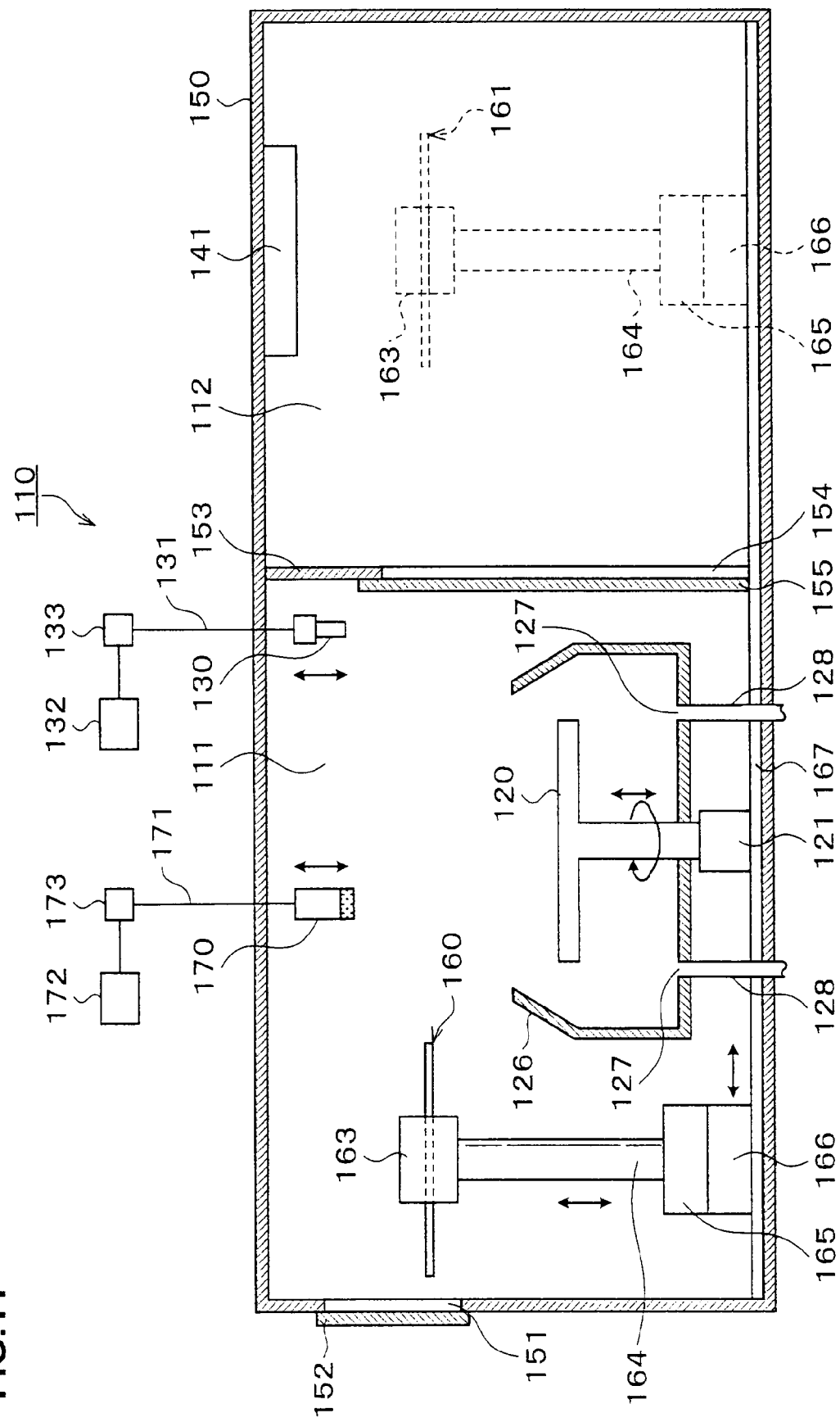
FIG. 11 is a longitudinal sectional view schematically showing the outline of a configuration of a coating treatment apparatus according to another embodiment.

In the first treatment chamber 111 of the coating treatment apparatus 110 of the above embodiment, a scribing brush 170 as a cleaning unit for cleaning the rear surface of the wafer W may further be provided as shown in FIG. 11. The scribing brush 170 is located above the spin chuck 120. A cleaning solution supply port (not shown) is formed in the lower surface of the scribing brush 170, and is connected to a cleaning solution supply source 172 via a cleaning solution supply pipe 171. The cleaning solution supply pipe 171 is also provided with a supply controller 173 including a valve, a flow control unit, and so on.

Figure 12:
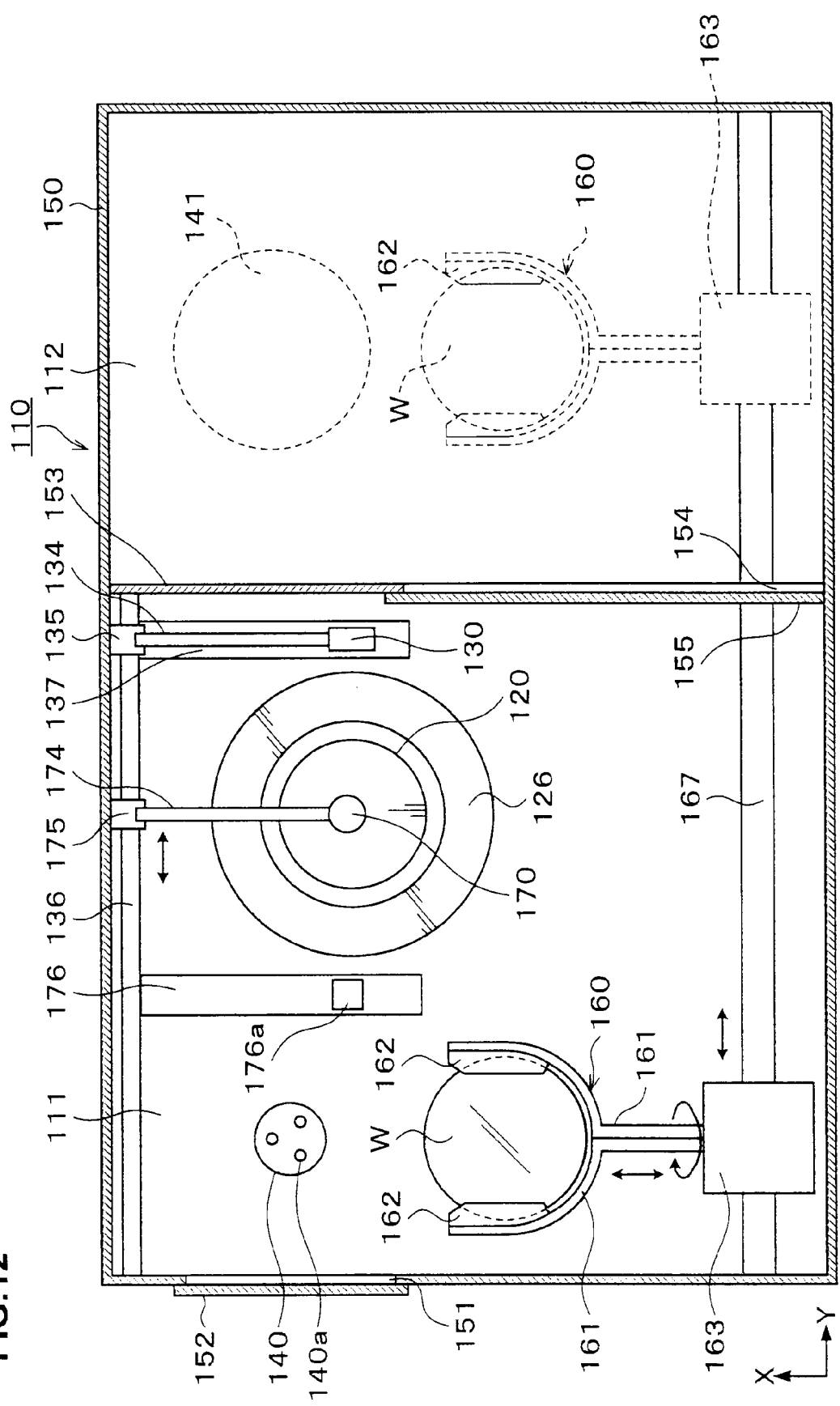
FIG. 12 is a plan view schematically showing the outline of a configuration of the coating treatment apparatus according to the other embodiment.

The scribing brush 170 is connected to a moving mechanism 175 via an arm 174 as shown in FIG. 12. The arm 174 is configured such that it can be moved by the moving mechanism 175 along the guide rail 136, from a waiting region 176 provided outside on the side of one end of the cup body 126 (the left side in FIG. 12) toward the other end side and vertically moved. The waiting region 176 is configured to be able to accommodate the scribing brush 170 and includes a cleaning portion 176a which can clean the tip end portion of the scribing brush 170.

In this case, after the wafer W is passed from the transfer arm 160 to the spin chuck 120, the wafer W is rotated by the rotating mechanism 121 and the scribing brush 170 is brought into contact with the rear surface of the wafer W. Thereafter, the rear surface of the wafer W is cleaned while the cleaning solution is being supplied from the cleaning solution supply port of the scribing brush 170. After the contaminants adhering to the rear surface of the wafer W are removed in the above manner, the scribing brush 170 is moved from above the wafer W to the waiting region 176. The coating nozzle 130 is moved to above the wafer W and applies the coating solution to the rear surface of the wafer W. The contaminants adhering to the rear surface of the wafer W are removed by the scribing brush 170 immediately before the coating solution is applied from the coating nozzle 130 to the rear surface of the wafer W, thereby ensuring that a coating film to be formed on the rear surface of the wafer W thereafter is planarized more reliably.

Figure 13:
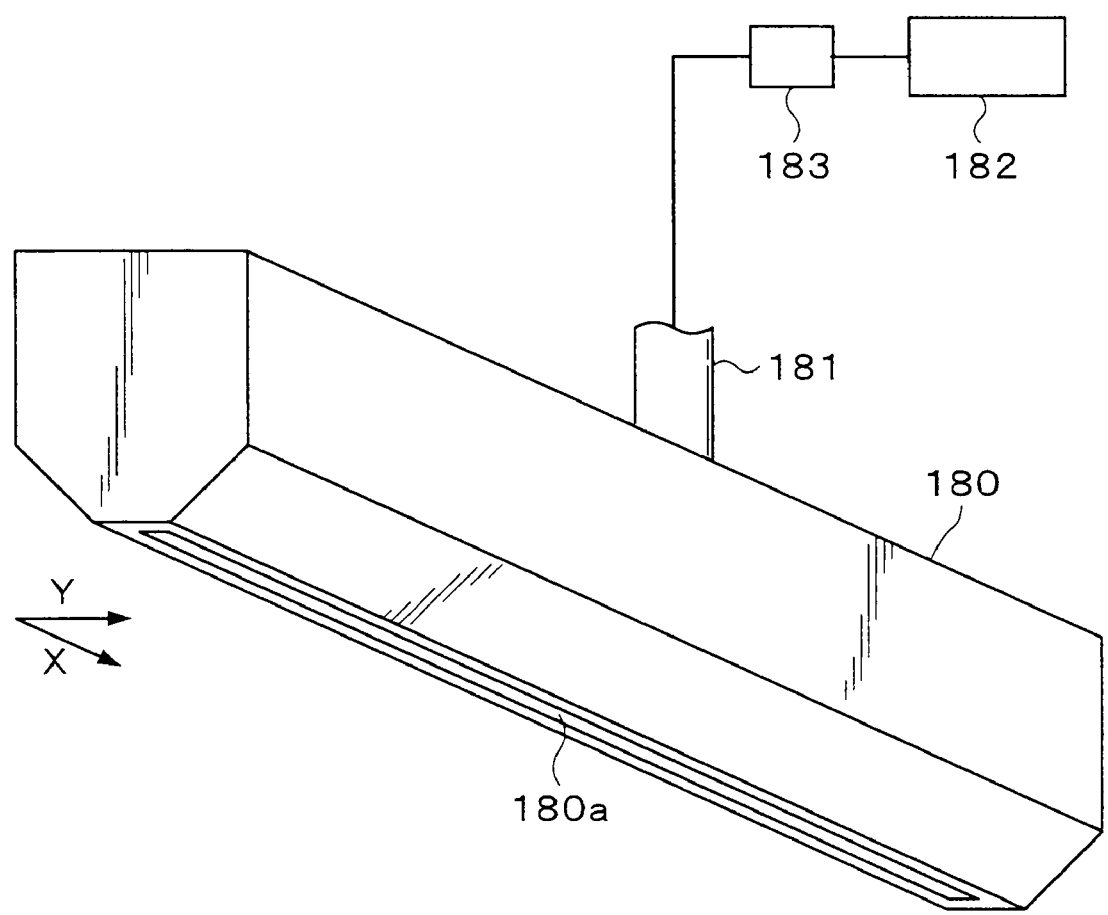
FIG. 13 is a perspective view of a coating nozzle having a discharge port in a slit form.
Figure 14:
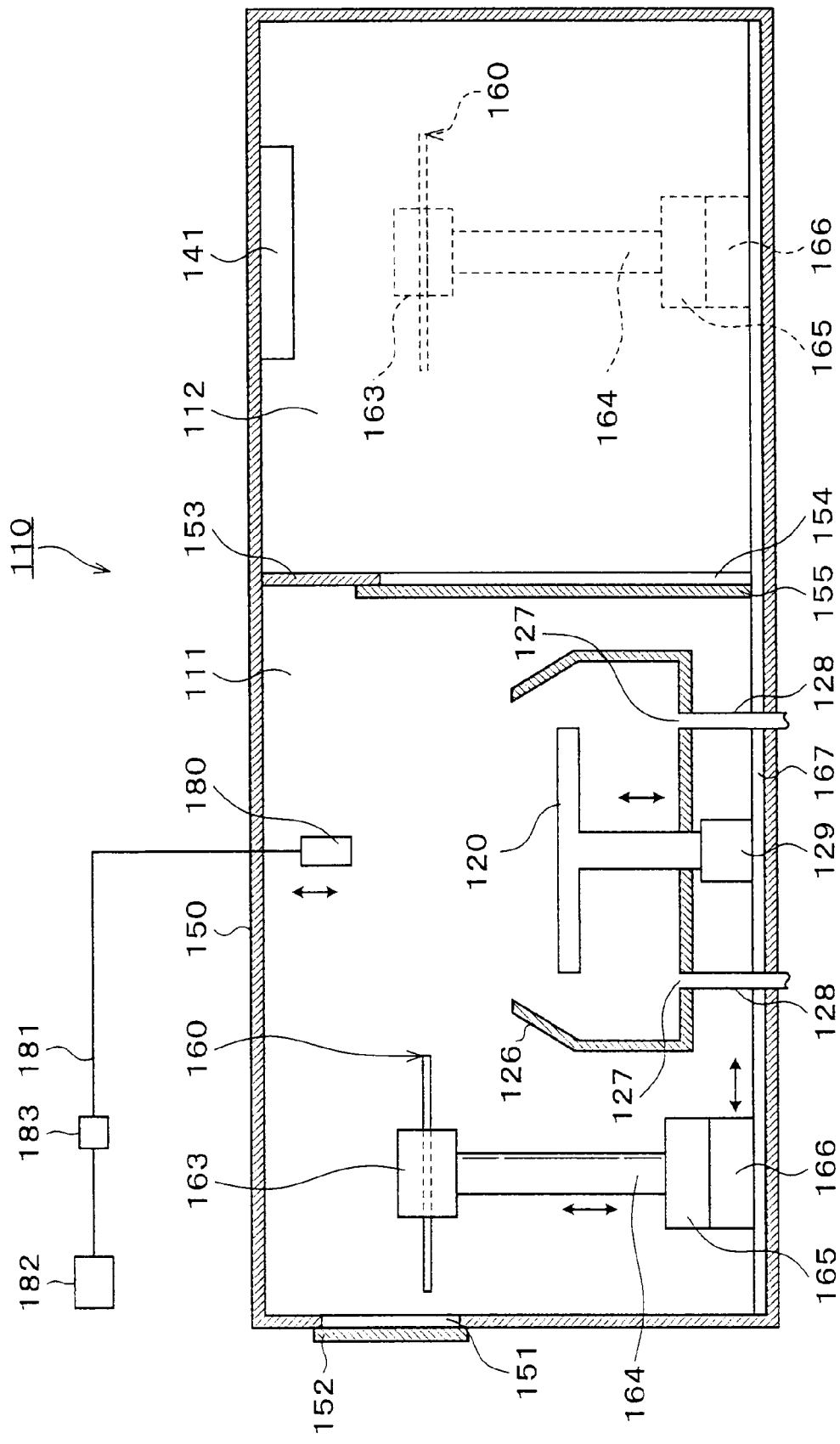
FIG. 14 is a longitudinal sectional view schematically showing the outline of a configuration of a coating treatment apparatus according to another embodiment.
Figure 15:
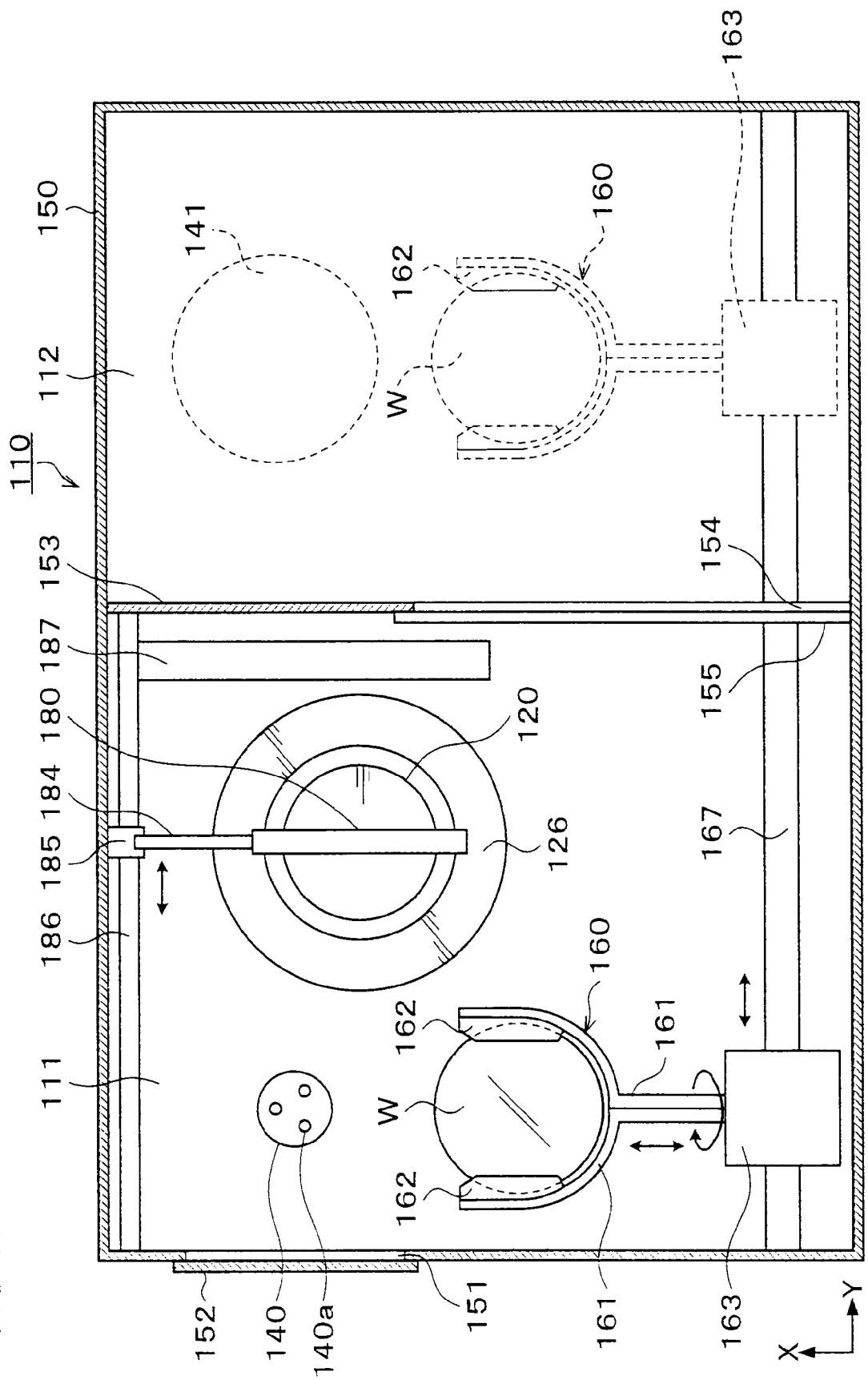
FIG. 15 is a plan view schematically showing the outline of a configuration of the coating treatment apparatus according to the other embodiment.

In place of the coating nozzle 130 used in the above embodiment, a coating nozzle 180 may be used which has a discharge port 180a in a slit form extending in the X-direction as shown in FIG. 13. To the upper portion of the coating nozzle 180, a coating solution supply pipe 181 is connected which leads to a coating solution supply source 182. The coating solution supply pipe 181 is also provided with a supply controller 183 including a valve, a flow control unit, and so on. As shown in FIG. 14 and FIG. 15, the coating nozzle 180 is formed, for example, longer than the width in the X-direction of the wafer W, and is connected to a moving mechanism 185 via an arm 184. The arm 184 can be moved by the moving mechanism 185 along a guide rail 186 provided along the Y-direction in the first treatment chamber 111, from a waiting region 187 provided outside on the side of one end of the cup body 126 (the right side in FIG. 15) toward the other end side and vertically moved. The waiting region 187 can accommodate the coating nozzle 180.

In the case where the coating nozzle 180 is used as described above, movement of the moving mechanism 187 allows the coating solution to be applied from the coating nozzle 180 to the rear surface of the wafer W. Accordingly, in place of the rotating mechanism 121 which rotates and raises and lowers the spin chuck 120, a raising and lowering mechanism 129 may be used which can only raise and lower the spin chuck 120 as shown in FIG. 15.

In place of the lamp heating unit 141 in the above embodiment, any of a publicly known ultraviolet irradiation unit (not shown) for applying ultraviolet rays and a publicly known electron beam irradiation unit (not shown) for applying electron beams to the coating solution applied on the wafer W may be provided. This allows selective use of the lamp heating unit 141, the ultraviolet irradiation unit, or the electron beam irradiation unit depending on the kind of the coating solution in use.

Although the coating treatment apparatus 110 is provided in the coating and developing treatment system 1 in the above embodiment, the coating treatment apparatus 110 may be provided outside the coating and developing treatment system 1. As such an example, a coating film forming system 200 has, as shown in FIG. 16 and FIG. 17, a configuration in which, for example, a cassette station 201 for transferring 25 wafers W per cassette as a unit from/to the outside into/from the coating film forming system 200 and transferring the wafers W into/out of a cassette C; and a treatment station 202 for performing treatment of forming the coating film on the rear surface of the wafer W, are integrally connected.

Figure 16:
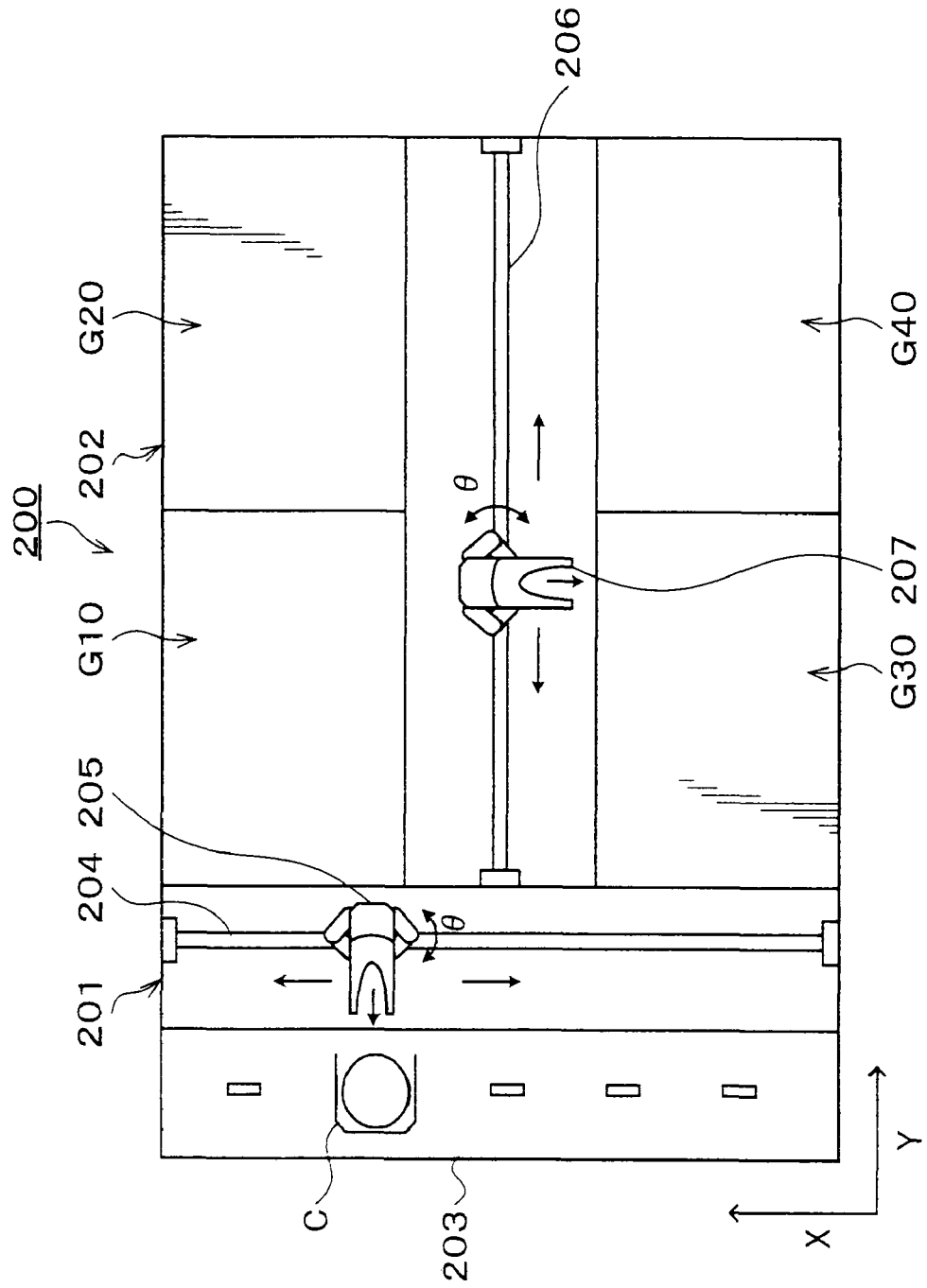
FIG. 16 is a plan view schematically showing the outline of a configuration of a coating film forming system incorporating coating treatment apparatuses according to another embodiment.

In the cassette station 201, a cassette mounting table 203 is provided and configured such that a plurality of cassettes C can be mounted thereon in a line in an X-direction (a top-to-bottom direction in FIG. 16). In the cassette station 201, a wafer transfer body 205 is provided which is movable in the X-direction on a transfer path 204. The wafer transfer body 205 is also movable in a wafer-arrangement direction of the wafers W housed in the cassette C (a Z-direction; the vertical direction), and thus can selectively access the wafer W in each of the cassettes C arranged in the X-direction. The wafer transfer body 205 is rotatable in a θ-direction around a Z-axis, and can access later-described coating treatment apparatuses 110 on the treatment station 202 side.

On the side of the positive direction in the X-direction (the upward direction in FIG. 16) in the treatment station 202, treatment unit groups G10 and G20 are placed in order from the cassette station 201 side, and on the side of the negative direction in the X-direction (the downward direction in FIG. 16), treatment unit groups G30 and G40 are placed in order from the cassette station 201 side. Between the treatment unit groups G10 and G20, and the treatment unit groups G30 and G40, a wafer transfer body 207 which is movable in the Y-direction on a transfer path 206 is provided. The wafer transfer body 207 is also movable in the X-direction and the vertical direction (the Z-direction) and rotatable in the θ-direction around the Z-axis to selectively access the treatment units in the treatment unit groups G10, G20, G30, and G40 and transfer the wafer W to them.

Figure 17:
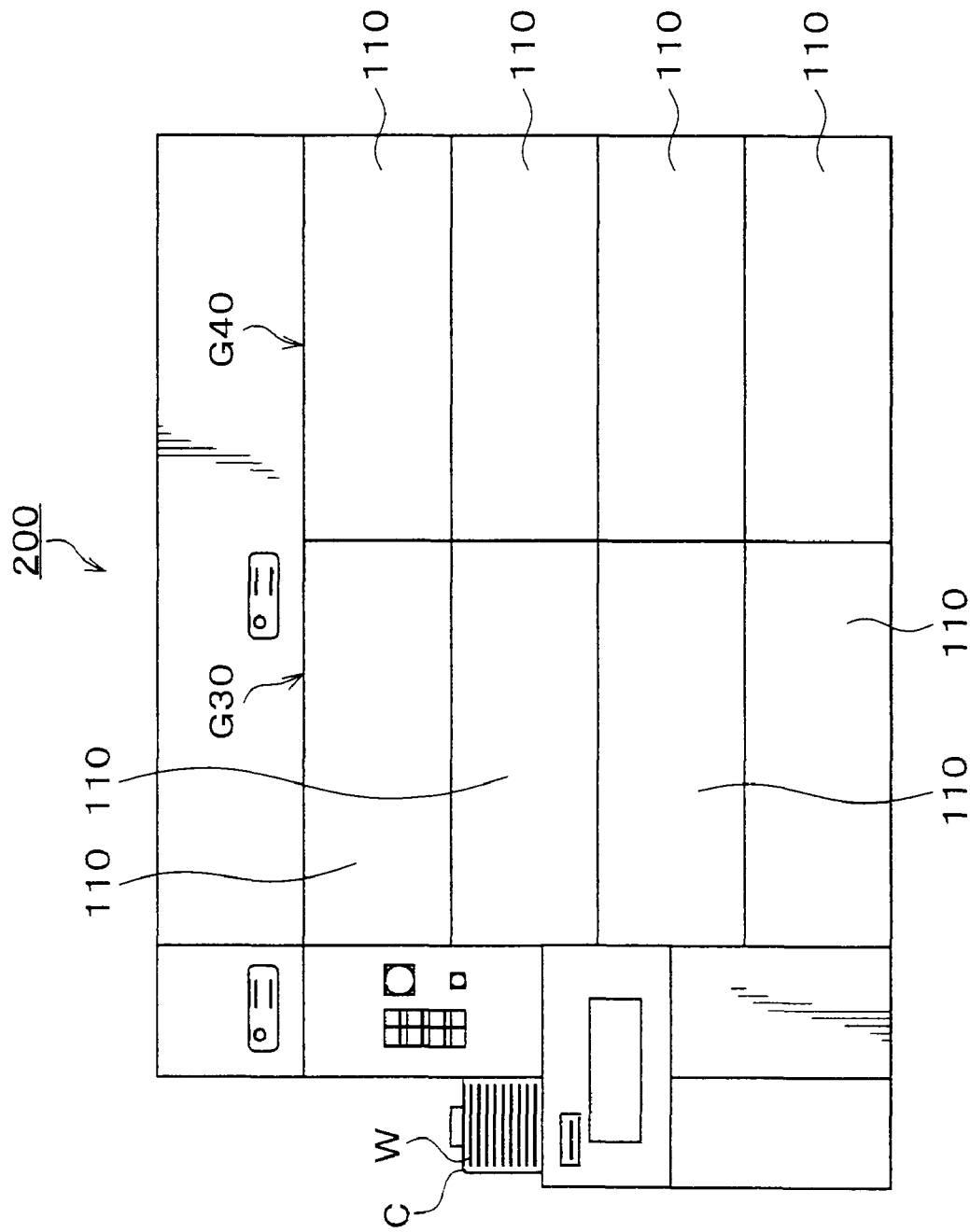
FIG. 17 is a front view of the coating film forming system according to the other embodiment.

In each of the treatment unit groups G30 and G40, as shown in FIG. 17, the coating treatment apparatuses 110 are four-tiered. Also in each of the treatment unit groups G10 and G20, the coating treatment apparatus 110 are four-tiered. More specifically, a total of 16 coating treatment apparatus 110 are provided in the treatment station 202. Since the plurality of coating treatment apparatuses 110 are provided in the coating film forming system 200, the coating films can be formed on the rear surfaces of a plurality of wafers W at the same time.

Figure 18:
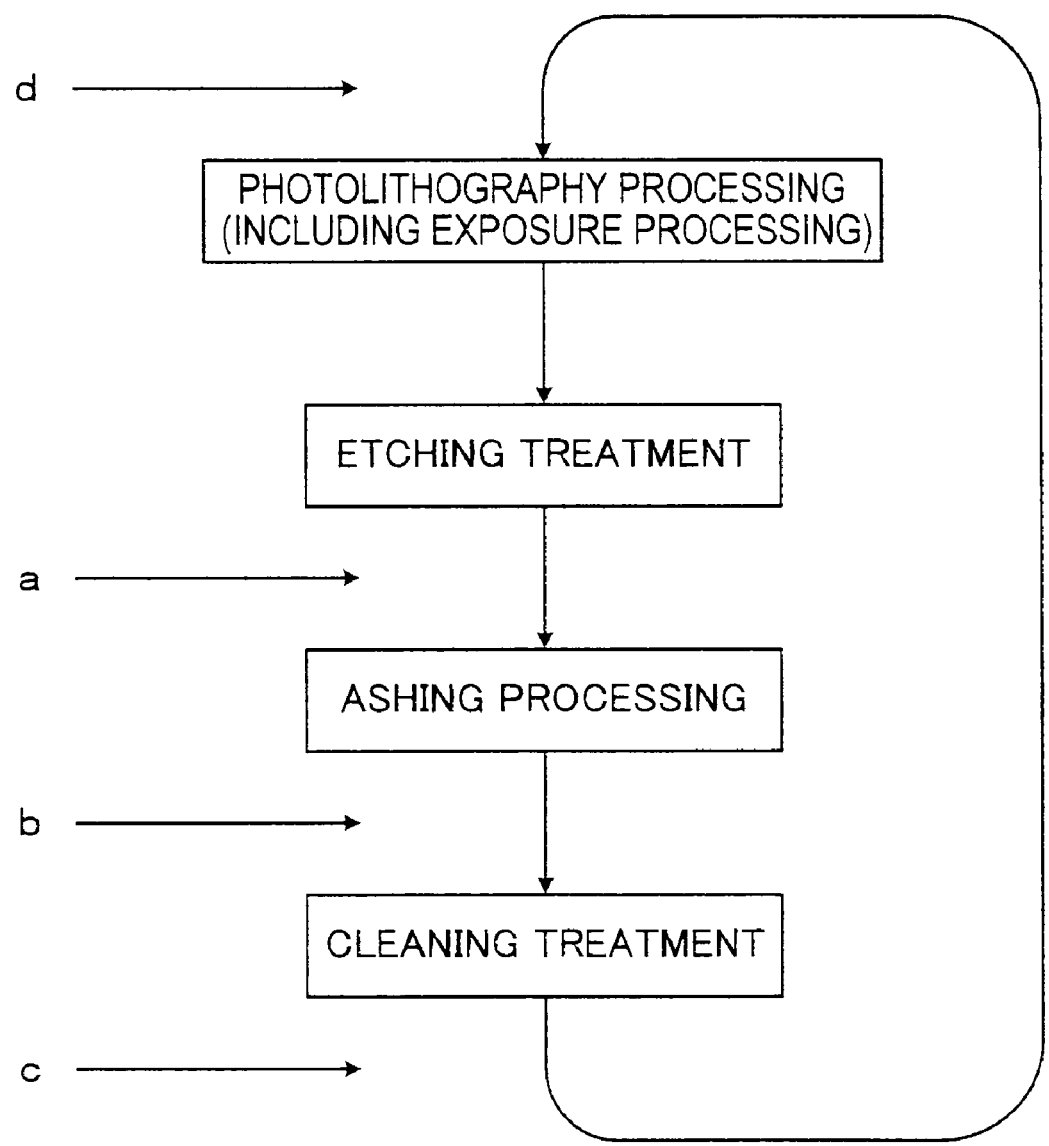
FIG. 18 is a flowchart showing a time to form the coating film by the coating film forming system.

The formation of the coating film on the rear surface of the wafer W by the coating film forming system 200 is performed, for example, after the etching treatment of the wafer W and before the ashing processing of stripping the resist film above the wafer W (an arrow a in FIG. 18). Thereby, even if the rear surface of the wafer W has got minute scratches during performance of the etching treatment, the coating film is formed to cover the scratches, so that the rear surface of the wafer W can be flat without projections and depressions for the exposure processing to be performed subsequent thereto. Note that the formation of the coating film by the coating film forming system 200 may be performed after the ashing processing and before the cleaning treatment of cleaning the front and rear surfaces of the wafer W (an arrow b in FIG. 18), or after the cleaning treatment and before the photolithography processing including the exposure processing (an arrow c in FIG. 18). Besides, the formation may be performed before the photolithography processing is performed for the first time (an arrow d in FIG. 18).

Although the inside of the coating treatment apparatus 110 is divided into the first treatment chamber 111 and the second treatment chamber 112 in the above embodiment, the first treatment chamber 111 and the second treatment chamber 112 may be divided into separate units. More specifically, the coating treatment apparatus 110 may be divided into a unit for applying the coating solution from the coating nozzle 130 to the rear surface of the wafer W and a unit for heating the wafer W using the lamp heating unit 141 to cure the coating solution on the rear surface of the wafer W.

Although the coating film is formed on the rear surface of the wafer W by applying the coating solution in the above embodiment, a thin film may be formed on the rear surface of the wafer W, for example, by the CVD (Chemical Vapor Deposition) method. In other words, a material gas may be supplied to the rear surface of the wafer W to deposit into a thin film on the rear surface of the wafer W by chemical catalytic reaction so as to planarize the rear surface of the wafer W.

Preferred embodiments of the present invention have been described above with reference to the accompanying drawings, but the present invention is not limited to the embodiments. It should be understood that various changes and modifications within the scope of the spirit as set forth in claims are readily apparent to those skilled in the art, and those should also be covered by the technical scope of the present invention. The present invention is also applicable, for example, to the case where the substrate is a substrate other than the wafer, such as an FPD (Flat Panel Display), a mask reticle for a photomask, or the like.

The present invention is useful to a method of treating a substrate, for example, a semiconductor wafer or the like, a coating treatment apparatus, and a substrate treatment system.

What is claimed is:

1. A coating treatment apparatus for forming a coating film on a rear surface of a substrate having a resist film formed on a front surface thereof, comprising:
a treatment container that houses the substrate;
a partition member that partitions said treatment container into a first treatment chamber and a second treatment chamber;
a transfer arm that supports and transfers the substrate transferred into said treatment container;
a turning mechanism that supports said transfer arm and turns said transfer arm around a horizontal axis;
a raising and lowering mechanism that supports said turning mechanism and raises and lowers said turning mechanism;
a transfer mechanism that supports said raising and lowering mechanism and transfers said raising and lowering mechanism in the horizontal direction between said first treatment chamber and said second treatment chamber;
a substrate holding unit located in said first treatment chamber that horizontally holds the substrate with the rear surface of the substrate directed upward;
a coating nozzle located in said first treatment chamber that applies a coating solution to the rear surface of the substrate held by said substrate holding unit;
a cleaning unit provided in the first treatment chamber that removes a contaminant on the rear surface of the substrate;
a curing processing unit located in said second treatment chamber for curing the coating solution applied from said coating nozzle to the rear surface of the substrate; and
a controller configured to control, when forming a coating film on the rear surface of the substrate, said turning mechanism to turn the transfer arm to invert the substrate held by said transfer arm, to control said transfer arm to pass the substrate to the substrate holding unit with the rear surface of the substrate directed upward, to control said cleaning unit to be brought into contact with the rear surface of the substrate held on said substrate holding unit to clean the rear surface of the substrate, to control said coating nozzle to apply a coating solution to the cleaned rear surface of the substrate, and to control the curing unit to cure the coating solution applied on the rear surface of the substrate.

2. The coating treatment apparatus as set forth in claim 1, wherein a rotating mechanism that rotates said substrate holding unit around a vertical axis is provided below said substrate holding unit.

3. The coating treatment apparatus as set forth in claim 1, wherein said coating nozzle is a nozzle having a discharge port in a slit form extending in a direction of a width of the substrate.

4. The coating treatment apparatus as set forth in claim 1, wherein said curing processing unit includes a heating unit that heats the coating solution applied from said coating nozzle to the rear surface of the substrate.

5. The coating treatment apparatus as set forth in claim 1, wherein said curing processing unit includes any of an ultraviolet irradiation unit that applies ultraviolet rays and an electron beam irradiation unit that applies electron beams, to the coating solution applied from said coating nozzle to the rear surface of the substrate.

6. A substrate treatment system comprising:
a coating treatment apparatus that forms a coating film on a rear surface of a substrates and
an exposure processing apparatus that performs exposure processing on the substrate,
said coating treatment apparatus: including,
a treatment container that houses the substrate,
a partition member that partitions said treatment container into a first treatment chamber and a second treatment chamber,
a transfer arm that supports and transfers the substrate transferred into said treatment container,
a turning mechanism that supports said transfer arm and turns said transfer arm around a horizontal axis,
a raising and lowering mechanism that supports said turning mechanism and raises and lowers said turning mechanism,
a transfer mechanism that supports said raising and lowering mechanism and transfers said raising and lowering mechanism in the horizontal direction between said first treatment chamber and said second treatment chamber, a substrate holding unit located in said first treatment chamber that horizontally holds the substrate with the rear surface of the substrate directed upward, a coating nozzle located in said first treatment chamber that applies a coating solution to the rear surface of the substrate held by said substrate holding unit, a cleaning unit provided in the first treatment chamber that removes a contaminant on the rear surface of the substrate, a curing processing unit located in said second treatment chamber for curing the coating solution applied from said coating nozzle to the rear surface of the substrate, and a controller configured to control, when forming a coating film on the rear surface of the substrate, said turning mechanism to turn the transfer arm to invert the substrate held by said transfer arm, to control said transfer arm to pass the substrate to the substrate holding unit with the rear surface of the substrate directed upward, to control said cleaning unit to be brought into contact with the rear surface of the substrate held on said substrate holding unit to clean the rear surface of the substrate, to control said coating nozzle to apply a coating solution to the cleaned rear surface of the substrate, and to control the curing unit to cure the coating solution applied on the rear surface of the substrate.

7. The coating treatment apparatus set forth in claim 1, wherein the coating solution is applied only within a range where the substrate is sucked in another treatment apparatus for performing treatment on the substrate after the coating solution has been cured.

* * * * *